United States Patent [19]

Kawamura

[11] Patent Number: 5,096,848
[45] Date of Patent: Mar. 17, 1992

[54] METHOD FOR FORMING SEMICONDUCTOR DEVICE ISOLATING REGIONS

[75] Inventor: Akio Kawamura, Nara, Japan

[73] Assignee: Sharp Kabushiki Kaisha, Osaka, Japan

[21] Appl. No.: 653,074

[22] Filed: Feb. 11, 1991

[30] Foreign Application Priority Data

Feb. 23, 1990 [JP] Japan .................. 1-43394

[51] Int. Cl.⁵ .......................... H01L 21/302
[52] U.S. Cl. .......................... 437/67; 437/61; 437/62; 437/69; 437/72; 437/73; 148/DIG. 50
[58] Field of Search .......... 437/67, 61, 62, 72, 437/47, 63, 69, 73; 148/DIG. 86, DIG. 85, DIG. 50

[56] References Cited

U.S. PATENT DOCUMENTS

| | | | |
|---|---|---|---|
| H204 | 2/1887 | Oh | 437/70 |
| 3,997,378 | 12/1976 | Kaji et al. | 437/63 |
| 4,476,623 | 10/1984 | El-Kareh | 437/63 |
| 4,569,701 | 2/1986 | Oh | 437/78 |
| 4,641,416 | 2/1987 | Iranmanesh | 148/DIG. 50 |
| 4,653,177 | 3/1987 | LeBowitz | 437/71 |
| 4,666,557 | 5/1987 | Collins | 437/67 |
| 4,745,081 | 5/1988 | Beyer | 437/67 |
| 4,842,675 | 6/1989 | Chapman | 437/62 |
| 4,859,622 | 8/1989 | Eguchi | 437/47 |
| 4,861,729 | 8/1989 | Fuse | 437/67 |
| 4,892,614 | 1/1990 | Chapman | 437/67 |
| 4,980,305 | 12/1990 | Kadota | 437/67 |
| 4,980,306 | 12/1990 | Shimbo | 437/34 |
| 4,980,310 | 12/1990 | Matsuda | 437/47 |

FOREIGN PATENT DOCUMENTS

| | | | |
|---|---|---|---|
| 0058838 | 4/1984 | Japan | 437/67 |
| 0038832 | 2/1985 | Japan | 437/67 |
| 0114130 | 5/1988 | Japan | 437/67 |
| 2-7529 | 1/1990 | Japan . | |

OTHER PUBLICATIONS

"A New Trench Isolation Technology as a Replacement of Locos" H. Mikoshiba, T. Homma and K. Hamano; IEDM Technical Digest, 1984, pp. 578-581.
"A Practical Trench Isolation Technology with a Novel Planarization Process" G. Fuse et al.; IEDM Technical Digest, 1987, pp. 732-735.
"Buried-Oxide Isolation with Etch-Stop (Boxes)", Ribert F. Kwasick et al., IEEE Electron Device Letters, vol. 9, No. 2, Feb. 1988.
IBM Technical Disclosure Bulletin vol. 23, No. 11, Apr. 1981.
IBM Technical Disclosure Bulletin vol. 24, No. 7B, Dec. 1981.

*Primary Examiner*—Brian E. Hearn
*Assistant Examiner*—Trung Dang
*Attorney, Agent, or Firm*—Nixon & Vanderhye

[57] ABSTRACT

A method for forming semiconductor device isolation regions including steps of forming a first insulating film on a semiconductor substrate, removing the first insulating film in a portion to become a device isolation region with use of a resist pattern formed in a one-time lithography step as a mask so as to form an opening which reaches the semiconductor substrate, removing the resist pattern to deposit a second insulating film on the first insulating film and the inside of the opening and then etching the entire surface in order to make the second insulating film remain on only the periphery of the bottom of the opening and to expose the surface of the semiconductor substrate in a central portion of the bottom of the opening, forming an oxide film on the surface of the semiconductor substrate exposed in the central portion of the bottom of the opening with use of the first insulating film and the second insulating film on the periphery of the bottom of the opening as a mask by a selective oxidation method, removing the second insulating film on the periphery of the bottom of the opening and then etching the surface of the semiconductor substrate exposed on the periphery of the bottom of the opening with use of the oxide film formed in the central portion of the bottom of the opening by the selective oxidation method and the first insulating film which remains in portions other than the device isolation region as a mask so as to form a trench, and burying the trench with a third insulating film.

3 Claims, 5 Drawing Sheets

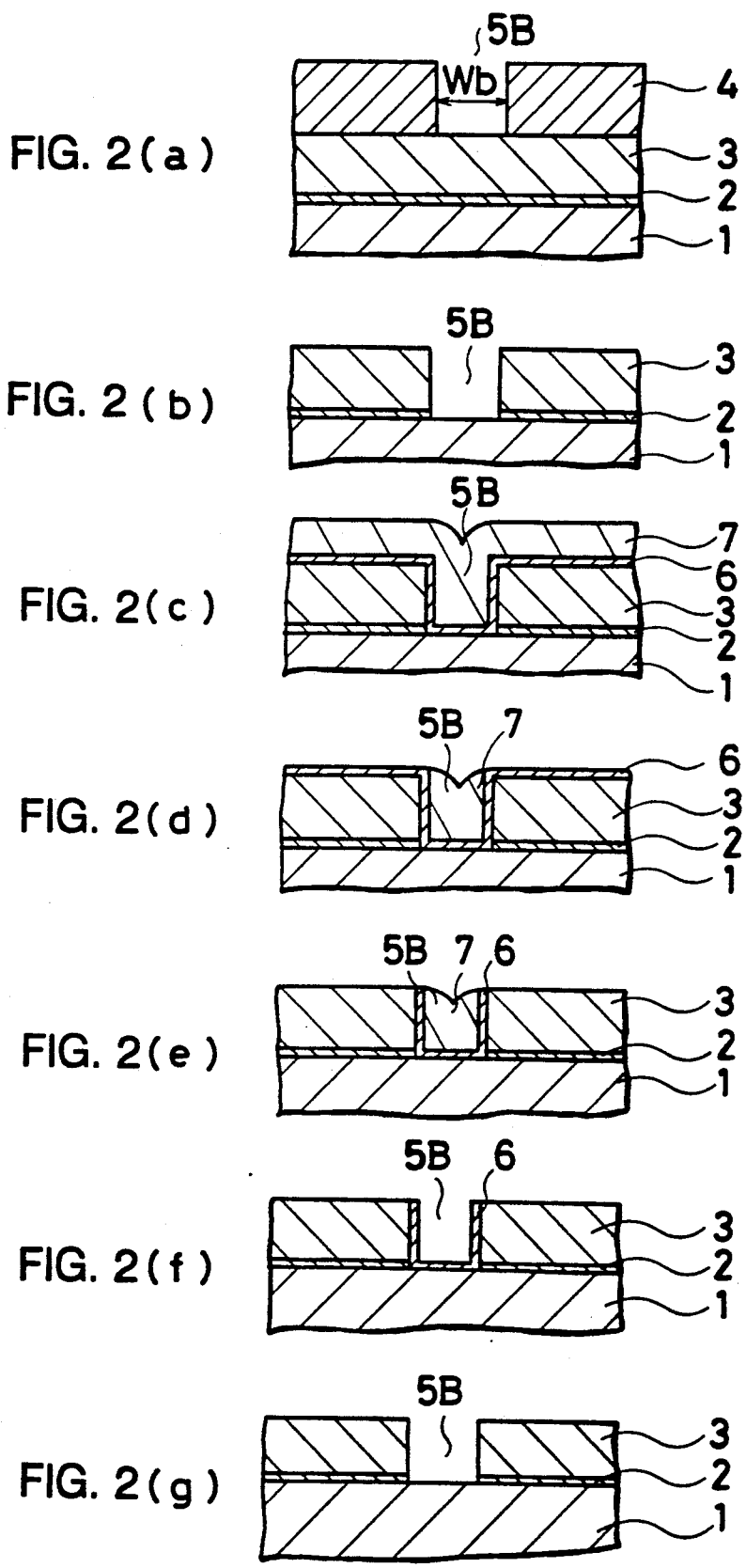

METHOD FOR FORMING SEMICONDUCTOR DEVICE ISOLATING REGIONS

BACKGROUND OF THE INVENTION

1. Field of the Invention

The present invention relates to a method for forming semiconductor device isolation regions to electrically isolate a semiconductor device constituting a semiconductor integrated circuit.

2. Description of the Prior Art

There has been increased capacity of VLSI (very large scale integrated circuit) such as a DRAM (a dynamic random access memory) or an SRAM (a static random access memory) by four times every three years. At present, a DRAM which is mainly manufactured has the capacities of 256 Kb and 1 Mb. There has earnestly been examined a DRAM having the capacities of 4 Mb and 16 Mb which will be the mainstream in future. Probably, there will be developed a DRAM having the capacities of 64 Mb and 256 Mb.

A semiconductor device constituting an integrated circuit is made fine, so that integration can be improved in a limited chip area as described above. By way of example, the minimum dimension of a MOS (metal oxide semiconductor) transistor used in an 1 Mb DRAM is a little less than 1 μm. In future, the above-mentioned minimum dimension will surely be reduced to 0.5 μm and further to 0.25 μm. Similarly, it is required to reduce device isolation regions for higher integration. In addition, it is necessary to reduce an isolation width from 1 μm to about 0.5 μm.

In general, the device isolation region is formed by a selective oxidation method. The selective oxidation method comprises steps of patterning and opening a silicon nitride film which covers a silicon substrate, and selectively oxidizing the surface of the exposed silicon substrate so as to form a silicon oxide film which is an insulating film.

According to the above-mentioned method, however, a region covered by the silicon nitride film is also oxidized at the time of selective oxidation. Consequently, there is caused the spreading of the silicon oxide film which is called a bird's beak. As a result, there cannot be obtained a fine isolation region in accordance with a mask size. In other words, referring to the selective oxidation method, the fineness of the device isolation region is limited. Therefore, the integration will not be improved in future. In addition, it is required to perform oxidation for hours so as to obtain an oxide film having a constant thickness in such a manner that sufficient insulation characteristics can be obtained. Furthermore, the oxidation causes a volume to be increased so that a stress is applied to the silicon substrate. Consequently, defects are caused to deteriorate device characteristics.

There has been proposed a trench burying isolation method as a device isolation method in place of the selective oxidation method having the above-mentioned drawbacks. The trench burying isolation method comprises steps of forming a trench on a silicon substrate with use of a resist pattern formed by lithography as an etching mask and burying the inside of the trench with an insulating film such as a silicon oxide film or the like.

The known references on a device isolation technology are as follows.

1. "A NEW TRENCH ISOLATION TECHNOLOGY AS A REPLACEMENT OF LOCOS"
   H. Mikoshiba, T. Homma and K. Hamano
   IEDM Technical Digest, 1984 P578 to 581
2. "A PRACTICAL TRENCH ISOLATION TECHNOLOGY WITH A NOVEL PLANARIZATION PROCESS"
   G. Fuse et al.
   IEDM Technical Digest, 1987 P732 to 735
3. "BURIED-OXIDE ISOLATION WITH ETCH-STOP (BOXES)"
   ROBERT F. KWASNICK et al.
   IEEE ELECTRON DEVICE LETTERS. Vol. 9, No. 2, February 1988.
4. IBM Technical Disclosure Bulletin, Vol. 23, No. 11 April 1981.
5. IBM Technical Disclosure Bulletin, Vol. 24, No. 7B December 1981.

While each device constituting a semiconductor integrated circuit is arranged very densely in a limited chip area, the density of a device is not constant on the inside of a chip. By way of example, a 4 Mb DRAM has a memory cell portion in which an isolation distance between adjacent devices is a little less than 1 μm, and a peripheral circuit portion in which the isolation distance between the adjacent devices is several μm or several tens of μm. In a device isolation process, it is required to form isolation regions having various widths in the same steps.

FIGS. 3(a) to 3(d) show the state in which large and small isolation regions are formed by a conventional trench burying isolation method in the same steps. There will be described the conventional trench burying isolation method with reference to FIG. 3.

(1) First, a resist pattern (not shown) is formed on a silicon substrate 21 in a lithography step. Then, a small trench 22 having a width W1 and a large trench 23 having a width W2 are formed with use of the resist pattern as an etching mask. The width W1 of the small trench 22 is the minimum and the width W2 of the large trench 23 is the maximum in an integrated circuit fabricated on the silicon substrate 21. The small and large trenches 22 and 23 have a depth d. The width W2 of the large trench 23 is greater than twice the depth d (see FIG. 3(a)).

(2) A silicon oxide film 24 having a thickness t2 is deposited on the silicon substrate 21 by a chemical vapor deposition method (hereinafter referred to as a CVD method) (see FIG. 3(b)).

The silicon oxide film 24 is also deposited on side walls of the trenches 22 and 23 at almost the same speed as on the surface of the silicon substrate 21. Consequently, the small trench 22 is entirely buried at a thickness of half the width W1. In case of the large trench 23 having the width greater than twice the depth, it is required to deposit the silicon oxide film 24 having a thickness which at least corresponds to the depth d in order to entirely bury the trench. As a result, it is required that a thickness t of the silicon oxide film 24 necessary to simultaneously and entirely bury both trenches on the silicon substrate 21 is not smaller than the depth d of the trench.

Although the surface of the silicon oxide film 24 is comparatively flat in the small trench 22, the flatness is reduced as the width of the trench is increased. As shown in FIG. 3(b), a difference D in stage corresponding to the depth d is formed in the large trench 23.

(3) To eliminate the difference D in stage, a resist pattern 25 is formed in the large trench 23 in the lithography step. The above-mentioned step is carried out in such a manner that the silicon oxide film in the large trench 23 is not removed in a step of removing the silicon oxide film 24 in a device region. Of course, it is desired that a thickness t3 of the resist pattern 25 is almost equal to the depth d of the trench and a width W3 is not more than a value obtained by subtracting twice the thickness t2 of the silicon oxide film 24 from the width W2 of the large trench 23. After the resist pattern 25 is formed, a resist or another spin coating film 26 is formed on the resist pattern 25 to make the surface thereof flat (see FIG. 3(c)).

(4) Finally, the spin coating film 26, resist pattern 25 and silicon oxide film 24 are etched at an equal speed until the surface of the silicon substrate 21 is exposed in the device region. Thus, the device isolation process is completed.

According to the trench burying isolation method, only the trench region, which is formed on the silicon substrate with use of the resist pattern formed in the lithography step as the etching mask, becomes an isolation region. Consequently, the isolation width can be reduced to the limit of the lithography. Therefore, the trench burying isolation method is suitable for a device isolation method of a semiconductor integrated circuit which has been improved in integration.

However, the conventional trench burying device isolation method comprises a lithography step of forming the resist pattern 25 in order to eliminate the difference D in stage of the silicon oxide film 24 in the large isolation region 23 in addition to a lithography step of defining the device isolation regions 22 and 23. In other words, it is required to carry out the lithography step twice in total. In addition, it is required to accurately arrange the resist pattern 25 in a concave portion of the silicon oxide film 24 in the large isolation region 23 in the latter lithography step. Consequently, a precise mask alignment is needed. In the case where the lithography step is added in a process for fabricating a semiconductor integrated circuit, the time required for the process is increased and the yield on a chip is lowered. Finally, a manufacturing cost is increased. Therefore, it is required to avoid the addition of the lithography step as much as possible.

SUMMARY OF THE INVENTION

It is an object of the present invention to provide a method for forming semiconductor device isolation regions by a trench burying isolation method, in which there is needed only a single lithography step of defining device isolation regions, in order to reduce the time required to form the device isolation regions, improve the reliability of a semiconductor integrated circuit and reduce a manufacturing cost.

A method for forming semiconductor device isolation regions according to the present invention comprises steps of forming a first insulating film on a semiconductor substrate, removing the first insulating film in a portion to become a device isolation region with use of a resist pattern formed in an one-time lithography step as a mask so as to form an opening which reaches the semiconductor substrate, removing the resist pattern to deposit a second insulating film on the first insulating film and the inside of the opening and then etching the entire surface in order to make the second insulating film remain on only the periphery of the bottom of the opening and to expose the surface of the semiconductor substrate in a central portion of the bottom of the opening, forming an oxide film on the surface of the semiconductor substrate exposed in the central portion of the bottom of the opening with use of the first insulating film and the second insulating film on the periphery of the bottom of the opening as a mask by a selective oxidation method, removing the second insulating film on the periphery of the bottom of the opening and then etching the surface of the semiconductor substrate exposed on the periphery of the bottom of the opening with use of the oxide film formed in the central portion of the bottom of the opening by the selective oxidation method and the first insulating film which remains in portions other than the device isolation region as a mask so as to form a trench, and burying the trench with a third insulating film.

BRIEF DESCRIPTION OF THE DRAWINGS

FIGS. 2(a)–2(k) are views showing the state in which a small device isolation region is formed on the same substrate simultaneously with the formation of the large device isolation region shown in FIG. 1.

DETAILED DESCRIPTION OF A PREFERRED EMBODIMENT

Figure 1A:
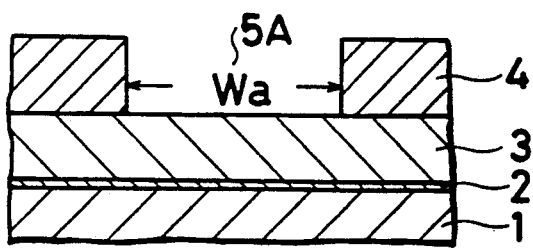
FIGS. 1(a)–1(k) are views showing steps of forming a large device isolation region by a method according to one embodiment of the present invention.

The present invention is characterized in that a lithography step is carried out only once so as to define device isolation regions, a trench to be buried with an insulating film is formed on the periphery of the device isolation region, and the surface of a semiconductor substrate surrounded by the trench is selectively oxidized to form the device isolation regions.

According to a method of the present invention, a trench is formed on the periphery of the bottom of an opening with use of a first insulating film and an oxide film formed in a central portion of the bottom of the opening by a selective oxidation method as a mask. Consequently, a lithography step is carried out only once to form a resist pattern for defining the device isolation region on the first insulating film at the beginning of the process for forming the device isolation regions. Subsequently, the lithography step is not carried out at all. Accordingly, the process is simplified so that the time required for the process can be reduced, as compared with the conventional method. In addition, the yield on a chip can be improved and a manufacturing cost can be reduced.

The oxide film is formed in the central portion of the device isolation region by the selective oxidation method. A trench to be buried with the insulating film is formed on only the periphery of the device isolation region. Consequently, if it is desired the device isolation region has a greater width, it is sufficient that the dimension of an oxide film region formed by the selective oxidation method is increased in a direction of a width and it is not required to increase a width of the trench. Consequently, the trench is simply and quickly buried so that a larger isolation region can easily be formed. In addition, since the periphery of the device isolation region is formed by a trench burying method, a region defined in the lithography step surely becomes a device isolation region. Furthermore, the oxide film is to be formed on only the surface of the semiconductor substrate in the central portion of the device isolation region by the selective oxidation method. Unlike the case where the device isolation region is formed by only the selective oxidation method, it is not required to make the thickness of the oxide film very great. Consequently, the oxidation time can be reduced. Furthermore, there is no possibility that the volume is increased owing to oxidation so that defects are caused.

In the case where the method of the present invention is embodied, a material and a thickness of a semiconductor substrate, a resist pattern, an insulating film and the like, and various processing means to be used are appropriately selected from the well-known ones in the art.

An embodiment of the present invention will be described in detail with reference to the drawings.

FIGS. 1(a) to (k) show the state in which a large device isolation region is formed on a semiconductor substrate by a method for forming device isolation regions according to one embodiment of the present invention. FIGS. 2(a) to (k) correspond to FIGS. 1(a) to (k) and show the state in which a small device isolation region is formed on the same substrate according to common steps simultaneously with the formation of the large device isolation region. There will be described a method for forming semiconductor device isolation regions according to the present embodiment with reference to FIGS. 1(a) to (k) and 2(a) to (k).

(a) As shown in FIGS. 1(a) and 2(a), the surface of a common silicon substrate 1 is thinly oxidized to form a silicon oxide film 2 having a thickness of 100 to 500 Å. Then, a silicon nitride film 3 is deposited on the silicon oxide film 2 at a thickness of 2000 to 5000 Å by a pressure reduction CVD method. The silicon oxide film 2 and silicon nitride film 3 form a first insulating film. Then, a resist pattern for defining a device isolation region is formed in an one-time photolithography step. With the resist pattern thus formed, a large device isolation region is defined by an opening 5A shown in FIG. 1(a) and a small device isolation region is defined by an opening 5B shown in FIG. 2(a). The width of the opening 5A is indicated at Wa, while the width of the opening 5B is indicated at Wb. A semiconductor device is formed on a silicon surface of a region covered by a resist pattern 4.

Figure 1B:
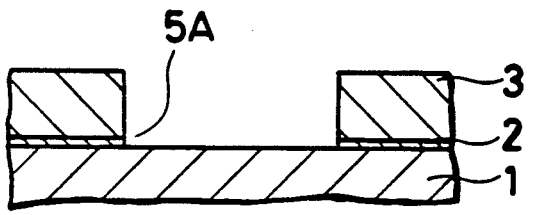

(b) As shown in FIGS. 1(b) and 2(b), the silicon nitride film 3 and silicon oxide film 2 are processed with use of the resist pattern 4 as an etching mask by a reactive ion etching (RIE) method to form openings 5A and 5B which reach the silicon substrate 1. (For convenience, there are used the same reference numerals as those of the openings of the resist patterns).

Figure 1C:
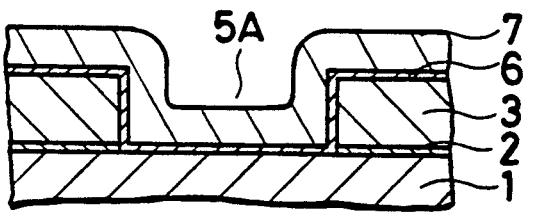

(c) As shown in FIGS. 1(c) and 2(c), a silicon nitride film 6 having a thickness of about 100 to 500 Å is formed and then a silicon oxide film 7 is deposited on the silicon nitride film 6 by the pressure reduction CVD method to form a second insulating film. In the case where the thickness of the silicon oxide film 7 is greater than half the width of the opening, the inside of the opening is entirely buried with the silicon oxide film 7 as shown in FIG. 2(c).

Figure 1D:
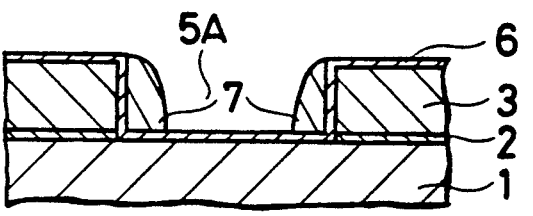

(d) The silicon oxide film 7 is anisotropically etched by the RIE method until the silicon nitride film 6 is exposed. As a result, the silicon oxide film 7 remains on only side walls of the opening 5A having the large width Wa as shown in FIG. 1(d). On the other hand, the silicon oxide film 7 remains with burying the opening 5B which has the small width Wb as shown in FIG. 2(d).

Figure 1E:
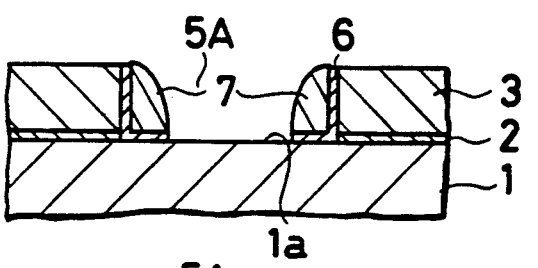
Figure 1F:
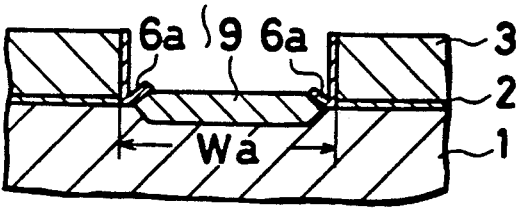
Figure 1G:
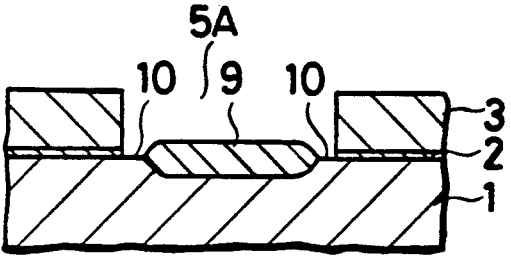
Figure 1H:
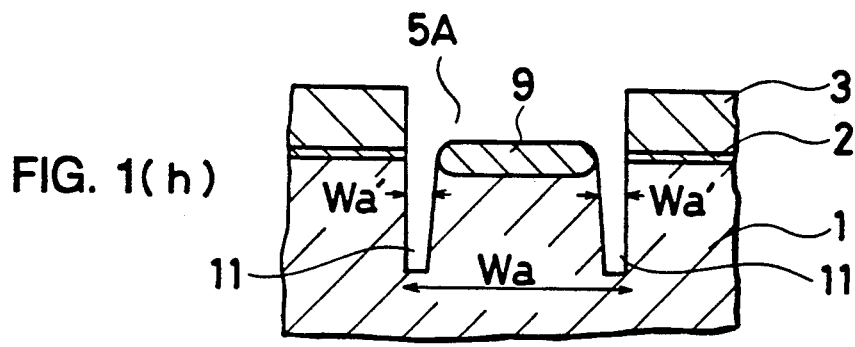
Figure 1I:
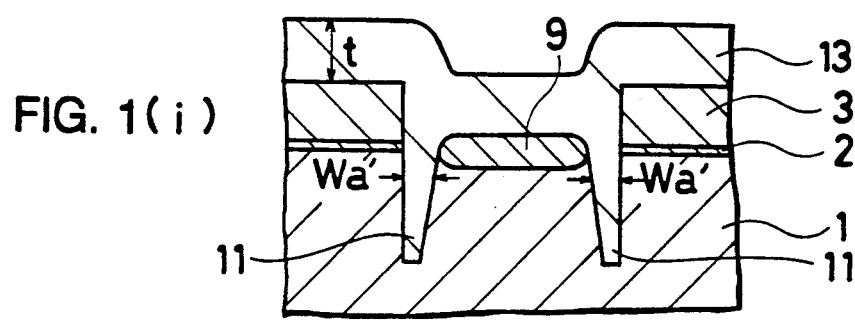
Figure 1J:
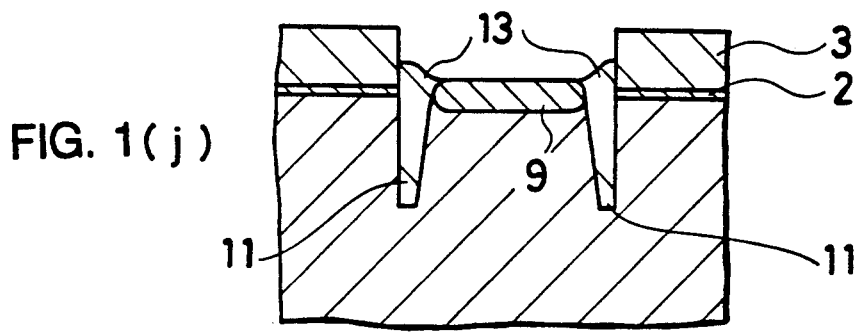
Figure 1K:
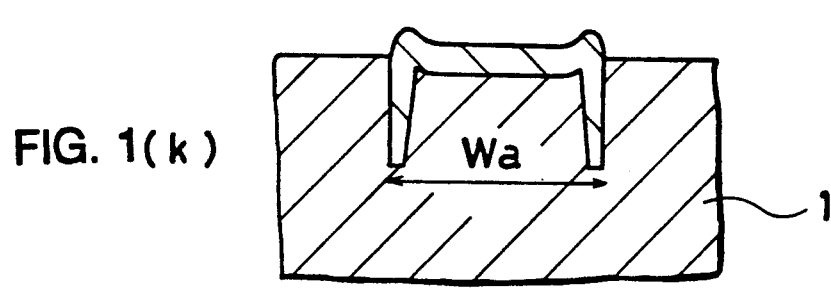
Figure 2H:
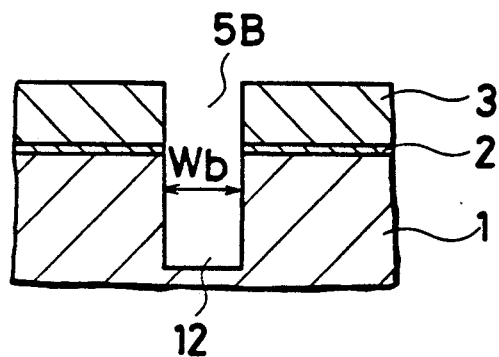
Figure 2I:
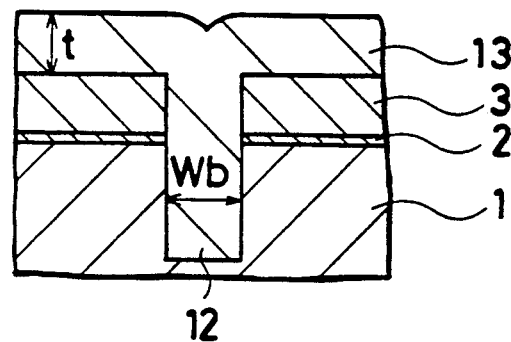
Figure 2J:
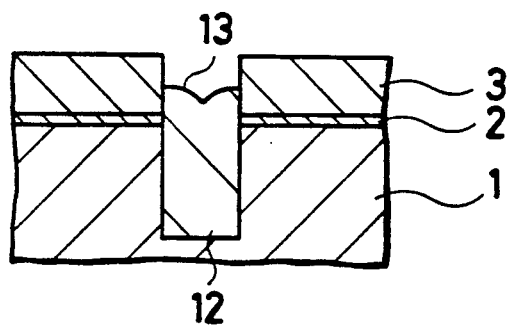
Figure 2K:
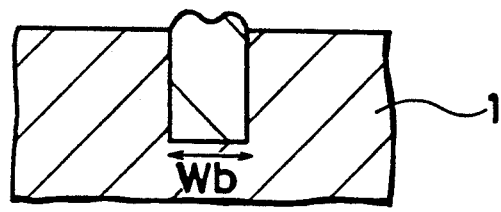
Figure 3A:
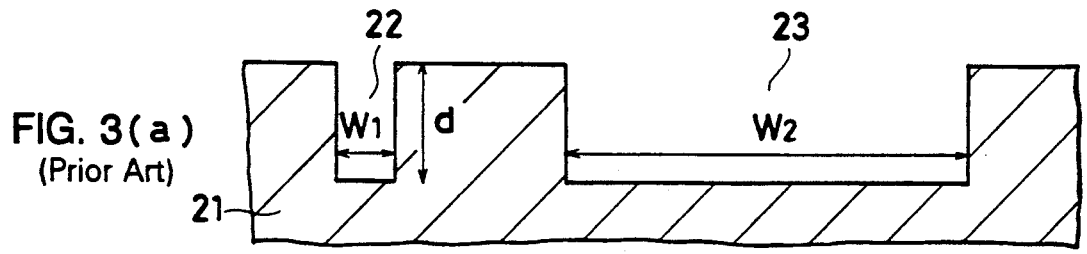
FIG. 3 is a view for explaining the drawbacks of a conventional trench burying device isolation method.
Figure 3B:
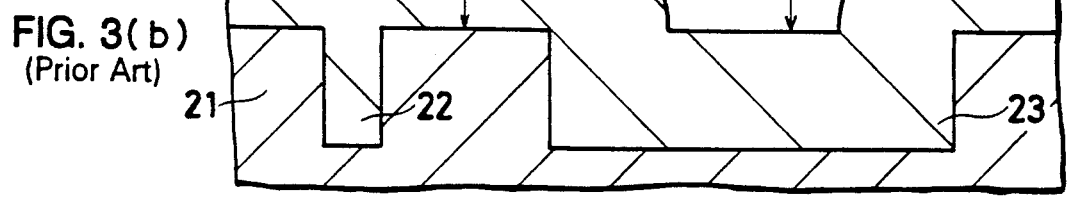
Figure 3C:
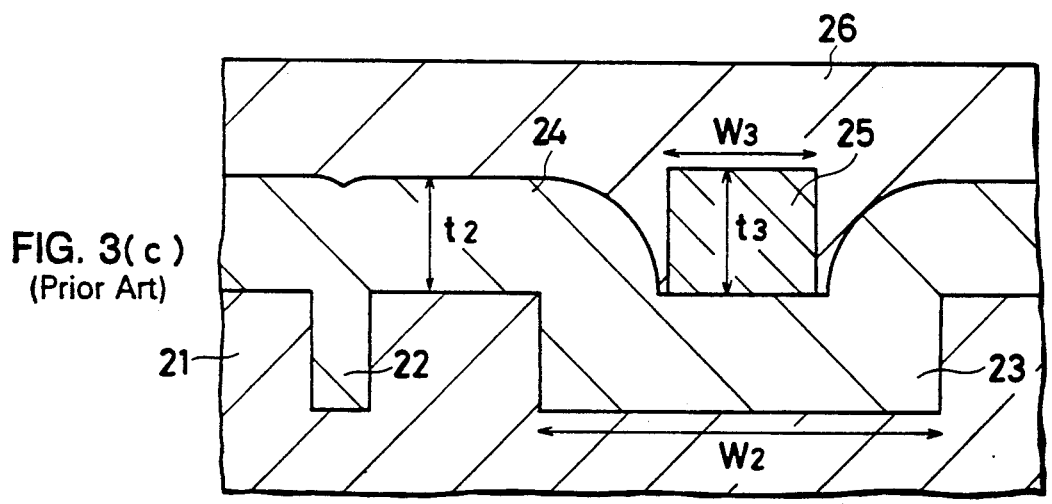
Figure 3D:
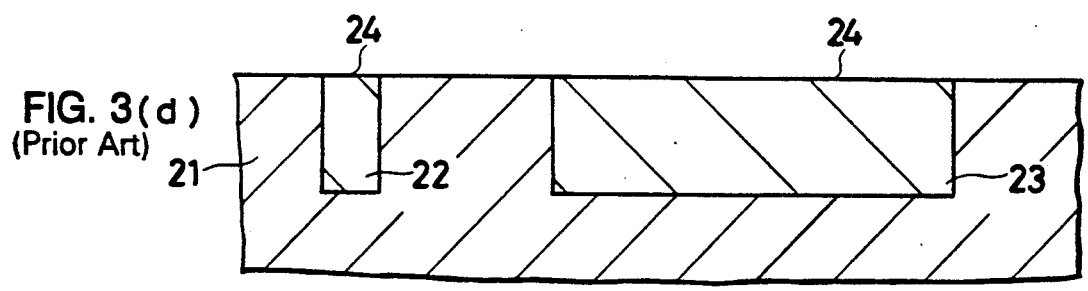

(e) The silicon nitride film 6 is etched anisotropically, i.e., vertically. Consequently, there are removed not only the silicon nitride film 6 on the silicon nitride film 3 but also the silicon nitride film 6, which is exposed in a central portion of the bottom of the opening 5A, in the large isolation region as shown in FIG. 1(e). As a result, the silicon substrate 1 is exposed. In the small isolation region, the opening 5B is entirely buried with the silicon oxide film 7. Consequently, only the silicon nitride film 6 on the silicon nitride film 3 is removed.

(f) After the silicon oxide film 7 is completely removed by using a diluted hydrofluoric acid solution, thermal oxidation is carried out. As a result, an exposure portion 1a of the silicon substrate 1 (see FIG. 1(e)) is oxidized so that a silicon oxide film 9 is formed in the large isolation region as shown in FIG. 1 (f). In this case, the spreading of a bird's beak, which appears at the time of locos oxidation, is restrained by a projection 6a of the thin silicon nitride film 6 on the periphery of the bottom of the opening 5A and the thick silicon nitride film 3. Consequently, the isolation region can be prevented from enlarging to have a width greater than the design width Wa.

In the small isolation region, the silicon substrate 1 is entirely covered by the thin silicon nitride film 6 in the opening 5B as shown in FIG. 2 (f). Consequently, the surface of the silicon substrate 1 is not oxidized.

In the oxidation step, the thickness of an oxide film to be formed is much smaller as compared with the case where device isolation regions are formed by only a selective oxidation method. Accordingly, the oxidation time is reduced. In addition, a volume is not increased so that defects are not caused on the silicon substrate.

(g) The projection 6a of the thin silicon nitride film 6 is removed and treated by using the diluted hydrofluoric acid solution. As a result, the bird's beak of the silicon oxide film 9 disappears so that the surface of the silicon substrate 1 is exposed in a peripheral portion 10 of the bottom of the opening 5A in the large isolation region as shown in FIG. 1 (g). In the small isolation region, the silicon substrate 1 is exposed over the width Wb of the opening 5B as shown in FIG. 2 (g). In this case, the width of the opening 5B is actually reduced by twice the thickness of the silicon nitride film 6. Since the thickness of the silicon nitride film 6 is much smaller than the width of the opening 5B. Consequently, the width Wb of the opening 5B is held.

(h) The silicon substrate 1 is anisotropically etched by the RIE method. In this case, the silicon nitride film 3 on both sides of the opening 5A and the silicon oxide film 9 in the central portion of the bottom of the opening 5A serve as an etching mask in the large isolation region. In the small isolation region, the silicon nitride film 3 on both sides of the opining 5B serves as an etching mask. Accordingly, it is not required to carry out another lithography step for etching.

As a result of etching, trenches 11, 11 having a width Wa' are formed on both sides of the silicon oxide film 9 in the large isolation region as shown in FIG. 1 (h). It is needless to say that the width Wa of the opening 5A is equal to a distance between side walls on the side protected by the silicon nitride film 3 of the etched surface of the semiconductor substrate 1 which forms side walls of the trenches 11, 11. On the other hand, a trench 12 is formed on the silicon substrate 1 in the small isolation region as shown in FIG. 2 (h). The trench 12 has the same width as the width Wb of the opening 5B. It is desired that the depths of the trenches 11, 12 are not less than 5000 Å in order to obtain sufficient device isolation characteristics. If necessary, impurities may be added to the bottom and side walls of the trenches 11, 12 in order to improve the isolation characteristic.

(i) A silicon oxide film 13 as a third insulating film is deposited by the pressure reduction CVD method (see FIGS. 1 (i) and 2 (i)). It is important that a thickness t of the silicon oxide film 13 should be greater than half the widths Wa', Wb in order to entirely bury the trenches 11, 12 in the large and small isolation regions respectively. In other words, the thickness t is represented with formula, $t > Wa'/2$ and $t > Wb/2$. In any case, since the trench having the width Wa is not buried, a value t can greatly be reduced as compared with a conventional trench burying device islolation method. Consequently, the deposit time for the silicon oxide film 13 can be reduced.

(j) The silicon oxide film 13 is anisotropically etched until the silicon nitride film 3 is exposed. As a result, the silicon oxide film 13 remains in only the trenches 11, 12 as shown in FIGS. 1 (j) and 2 (j).

(k) Finally, the silicon nitride film 3 and silicon oxide film 2, which cover the device region, are removed by using thermal phosphoric acid and the diluted hydrofluoric acid solution, respectively. Consequently, a series of steps for forming device isolation regions are completed.

FIGS. 1 (k) and 2(k) show the shape of sections of the large and small device isolation regions obtained in the series of steps mentioned above. As shown in FIGS. 1 (k) and 2 (k), the widths of the device isolation regions finally obtained are equal to the widths Wa and Wb of the openings 5A and 5B of the resist patterns formed in the large and small isolation regions in the step (a), respectively.

Thus, a large device isolation region can be formed more easily in a shorter time as designed, as compared with the conventional trench burying device isolation method. In addition, the device isolation region can be reduced to the limit of the lithography. Consequently, an integrated circuit will be made finer in future.

When the eivice isolation region is formed through the above-mentioned steps, a device such as a MOS transistor or capacitor is formed in an active region of the silicon substrate 1 according to a normal method. Thus, a semiconductor integrated circuit having the device isolation regions is perfected The MOS transistor thus formed is measured. As a result, there can be obtained characteristics which are not inferior to those of a transistor isolated by the selective oxidation method and having the same size. In particular, there is no possibility that the defects of the silicon substrate are caused owing to increase in volume which appears in the case where the device isolation region is formed by only the selective oxidation method. Consequently, a backward leak characteristic value for junction is set to be extremely small. Referring to a parasitic MOS transistor which is necessarily formed between adjacent devices, even if an isolation width is 0.5 μm, a field inverted voltage and a field punch through voltage are not smaller than twice a supply voltage.

The present invention relates to a method for forming semiconductor device isolation regions. Materials, means, numeric values and the like are not limited to those of the present embodiment except for Claims.

As described above, according to a method for forming semiconductor device isolation regions of the present invention, an oxide film is formed in a central portion of the bottom of an opening with use of a second insulating film, which remains on the periphery of the bottom of the opening, as a amsk. A trench is formed on the periphery of the bottom of the opening with use of the oxide film and a first insulating film as a mask. A device isolation region is formed by the oxide film and a third insulating film which buries the trench. Consequently, a lithography step is carried cout only once in order to form the opening through all steps. Unlike a conventional trench burying device isolation method, it is not required to carry out a lithography step in which a precise mask alignment is executed to make a large device isolation region flat. Consequently, the process time and the number of steps required to fabricate a semiconductor integrated circuit can greatly be reduced, as compared with the conventional trench burying device isolation method. In addition, the yield on a chip can be improved so that a manufacturing cost can greatly be reduced.

The present invention can be applied from a very fine device isolation region to become the limit of lithography to a sufficiently large device isolation region. Furthermore, the device isolation regions having any size and shape can precisely be formed in accordance with a resist pattern formed in the lithography step. Accordingly, complicated conditions such as pattern shift and the like are eliminated so that a circuit layout can easily be made. In addition, the semiconductor integrated circuit can be made much finer.

Since it is not required to increase the thickness of the oxide film to be formed in a selective oxidation step according to the present invention, the oxidation time can be reduced. Furthermore, defects are not caused owing to increase in volume so that good device characteristics can be obtained.

What is claimed is:

1. A method for forming semiconductor device isolation regions comprising steps of:

forming a first insulating film on a semiconductor substrate, removing the first insulating film in portions to become device isolation regions with use of a resist pattern formed in an one-time lithography step as a mask so as to form a plurality of openings for forming the device isolation regions down to the semiconductor substrate, removing the resist pattern to deposit on the first insulating film and inside the opening a second insulating film of a stacked structure having a SiN film as the lowermost layer to a thickness more than half the width of an opening for the narrowest device isolation region, and then etching the entire surface in order to make the second insulating film remain on only the periphery of the bottom of the openings other than the opening for the narrowest device isolation region and to expose the surface of the semiconductor substrate in a central portion of the bottom of the openings, while the second insulating film remains so as to cover at least the opening for the narrowest device isolation region, forming an oxide film on the exposed surface of semiconductor substrate in the central portion of the bottom of the openings, except the opening for the narrowest device isolation region, with the first insulating film and the second insulating film remaining on the periphery of the bottom of the opening, acting as a mask by a selective oxidation method, removing the second insulating film remaining on the surface of the substrate and on the periphery of the bottom of the opening, etching the surface of the semiconductor substrate exposed on the periphery of the bottom of the openings with use of the oxide film formed in the central portion of the bottom of the openings by said selective oxidation method and the first insulating film remaining in portions other than the device isolation region as a mask so as to form trenches, and at the same time etching the surface of the semiconductor substrate exposed in the bottom of the opening for the narrowest device isolation region so as to form a trench, and burying each trench with a third insulating film.

2. A method for forming semiconductor device isolation regions according to claim 1, wherein impurities are added to the bottom and side walls of the trench.

3. A method according to claim 1, wherein the second insulating film is formed by stacking a SiN film and a $SiO_2$ film in this order.

* * * * *